(12) United States Patent
Kai

(10) Patent No.: US 8,423,922 B2
(45) Date of Patent: Apr. 16, 2013

(54) PHOTOMASK DESIGNING METHOD AND PHOTOMASK DESIGNING PROGRAM

(75) Inventor: Yasunobu Kai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 331 days.

(21) Appl. No.: 12/850,082

(22) Filed: Aug. 4, 2010

(65) Prior Publication Data
US 2011/0072402 A1    Mar. 24, 2011

(30) Foreign Application Priority Data
Sep. 18, 2009    (JP) .................................. 2009-216695

(51) Int. Cl.
*G06F 17/50*    (2006.01)

(52) U.S. Cl.
USPC .............................................. 716/53; 716/50

(58) Field of Classification Search .......................... None
See application file for complete search history.

(56) References Cited

U.S. PATENT DOCUMENTS

| | | | | |
|---|---|---|---|---|
| 7,231,629 B2* | 6/2007 | Laidig | ............................. | 716/51 |
| 7,247,574 B2 | 7/2007 | Broeke et al. | | |
| 7,315,999 B2* | 1/2008 | Melvin et al. | .................... | 716/52 |
| 7,421,678 B2* | 9/2008 | Barnes et al. | .................... | 716/50 |
| 7,458,059 B2* | 11/2008 | Stirniman et al. | .............. | 716/53 |
| 7,475,382 B2* | 1/2009 | Melvin et al. | .................... | 716/51 |
| 7,509,621 B2* | 3/2009 | Melvin, III | ...................... | 716/51 |
| 7,594,199 B2* | 9/2009 | Socha et al. | ..................... | 716/53 |
| 7,721,246 B2* | 5/2010 | Li et al. | ............................ | 716/55 |
| 7,774,736 B2* | 8/2010 | Broeke et al. | .................... | 716/53 |
| 7,882,480 B2* | 2/2011 | Ye et al. | ........................... | 716/53 |
| 7,927,773 B2* | 4/2011 | Hakko | ........................... | 430/30 |
| 7,954,071 B2* | 5/2011 | Barnes et al. | .................... | 716/53 |
| 8,037,429 B2* | 10/2011 | Shang et al. | ..................... | 716/53 |
| 8,037,446 B2* | 10/2011 | Futrell et al. | .................... | 716/136 |
| 8,144,967 B2* | 3/2012 | Kawashima | .................. | 382/141 |
| 2006/0147815 A1* | 7/2006 | Melvin, III | ...................... | 430/5 |
| 2006/0188673 A1* | 8/2006 | Melvin et al. | ................ | 428/34.4 |

FOREIGN PATENT DOCUMENTS

| | | |
|---|---|---|
| JP | 8-76348 | 3/1996 |
| JP | 9-34095 | 2/1997 |
| JP | 9-297388 | 11/1997 |
| JP | 2001-255642 | 9/2001 |

(Continued)

OTHER PUBLICATIONS

Japanese Office Action issued Aug. 4, 2011, in Patent Application No. 2009-216695 (with English-language translation).

(Continued)

*Primary Examiner* — Leigh Garbowski

(74) *Attorney, Agent, or Firm* — Oblon, Spivak, McClelland, Maier & Neustadt, L.L.P.

(57) ABSTRACT

In one embodiment, a photomask designing method for creating a pattern layout having an assist pattern placed around a design pattern is disclosed. The method can place a plurality of evaluation points around the design pattern and set an evaluation index for imaging properties of the design pattern on an imaging surface. The method can combine a light intensity distribution of the design pattern with light intensity distributions of the evaluation points to obtain a light intensity distribution on the imaging surface and evaluate the light intensity distribution on the imaging surface using the evaluation index to determine a region having an effective evaluation point placed. In addition, the method can determine a placement condition for the assist pattern based on the region where the effective evaluation point is placed and place the assist pattern around the design pattern based on the placement condition to create the pattern layout.

18 Claims, 4 Drawing Sheets

FOREIGN PATENT DOCUMENTS

| | | |
|---|---|---|
| JP | 2002-323748 | 11/2002 |
| JP | 2004-272228 | 9/2004 |
| JP | 2006-189845 | 7/2006 |
| JP | 2006-235607 | 9/2006 |
| JP | 2007-109969 | 4/2007 |
| KR | 10-0444558 | 4/2005 |

OTHER PUBLICATIONS

Office Action issued Feb. 1, 2012 in Japan Application No. 2009-216695 (With English Translation).

Korean Office Action issued Apr. 26, 2012, in Korea Patent Application No. 10-2010-0081546 (with English translation).

* cited by examiner

PHOTOMASK DESIGNING METHOD AND PHOTOMASK DESIGNING PROGRAM

CROSS-REFERENCE TO RELATED APPLICATIONS

This application is based upon and claims the benefit of priority from the prior Japanese Patent Application No. 2009-216695, filed on Sep. 18, 2009; the entire contents of which are incorporated herein by reference.

FIELD

Embodiments described herein relate generally to a photomask designing method and a photomask designing program.

BACKGROUND

In fabricating an electronic device such as a semiconductor device or a flat panel display, a fine pattern is formed on the surface of a substrate (for example, a wafer or the like) by a photolithography process. In designing by such a photolithography process, what are mainly determined are: Illumination condition of an exposure apparatus, a pattern layout of a photomask, an advantageous pattern layout of a device to exposure, and so forth.

In recent years, patterns have become finer and the degree of fineness is approaching the resolution limit of an exposure apparatus. Accordingly, illumination conditions of an exposure apparatus are often set to be suitable for transferring the densest pattern (the finest pattern). Hence, in order to Improve the exposure latitude and depth of focus for patterns other than the densest pattern even under such illumination conditions of an exposure apparatus, there has been proposed a technique in which a fine assist pattern Is placed around a mask pattern (hereinafter, referred to as a design pattern) (for example, refer to JP-A 2002-323748 (Kokai)).

However, when the assist pattern is included, the number of conceivable pattern layouts for a photomask becomes enormous, making it extremely difficult to perform a comprehensive simulation. For this reason, a design is made according to an optimization method to obtain an optimal solution. Specifically, an assist pattern is placed based on the experience of a designer, and verification is repeated on the basis of the pattern layout.

By designing with the optimization method, a pattern layout including an assist pattern can be determined. Nevertheless, the method leads to increases in cost and time in designing. Moreover, the designing method has a difficulty in obtaining the optimal solution because the placement, size, number, and the like, of the assist pattern are determined based on the experience of a designer in a trial-and-error manner.

Against this problem, there has been proposed a technique for automatically placing an assist pattern under predetermined conditions around a design pattern by use of a computer (refer to JP-A 9-297388 (Kokai)(1997)).

According to the technique disclosed in JP-A 9-297388 (Kokai)(1997), an assist pattern can be placed within practical time and cost.

However, when multiple assist patterns are simply placed, the lithographic latitude (the exposure latitude and depth of focus) may be reduced due to interaction among the assist patterns.

DETAILED DESCRIPTION

Figure 1:
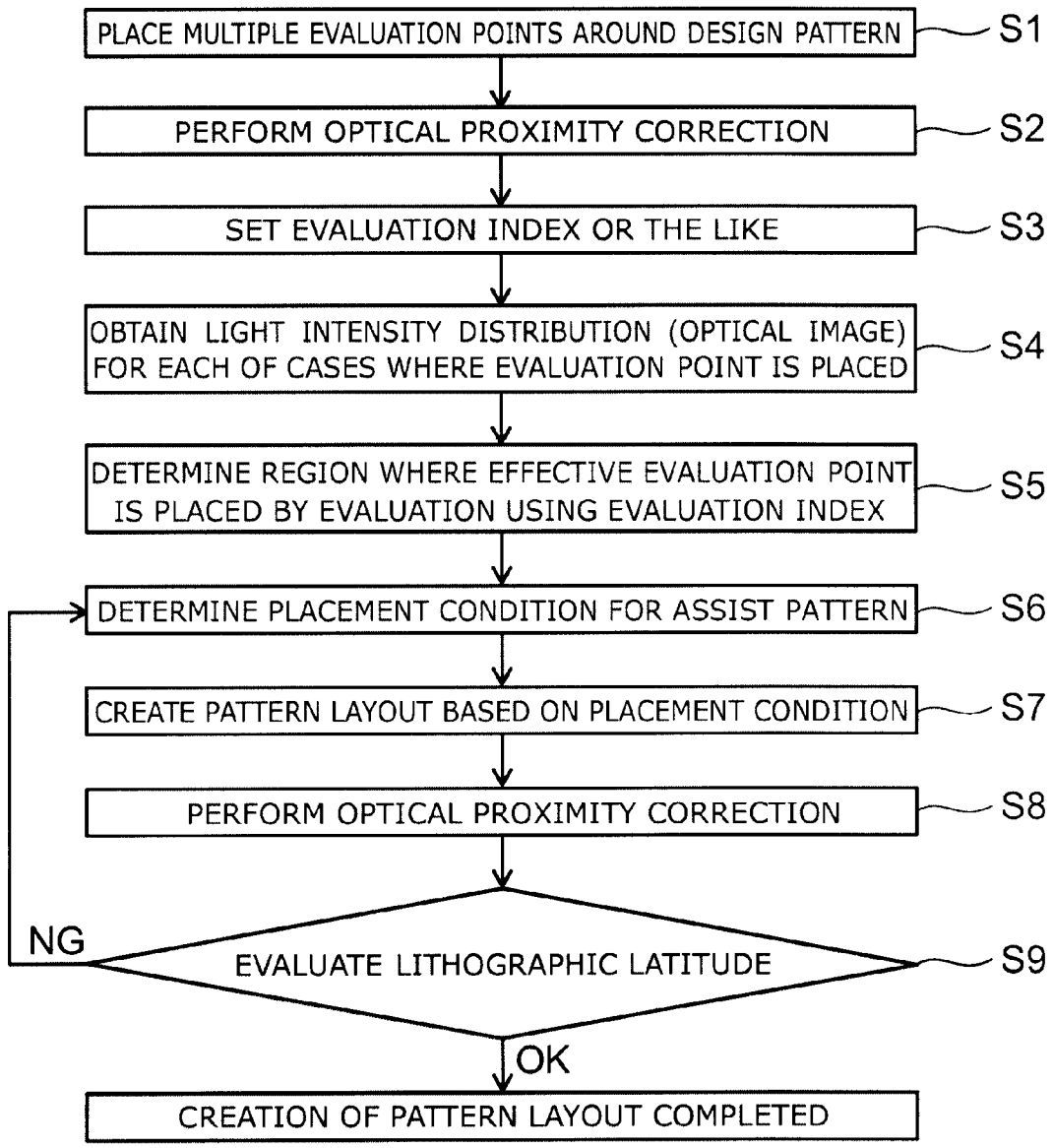
FIG. 1 is a flowchart for exemplifying a photomask designing method according to this embodiment.

In general, according to one embodiment, a photomask designing method for creating a pattern layout having an assist pattern placed around a design pattern is disclosed. The method can place a plurality of evaluation points around the design pattern. The method can set an evaluation index for imaging properties of the design pattern on an imaging surface. The method can combine a light intensity distribution of the design pattern with light intensity distributions of the evaluation points to obtain a light intensity distribution of the design pattern on the imaging surface and evaluate the light intensity distribution of the design pattern on the imaging surface using the evaluation index to determine a region having an effective evaluation point placed. In addition, the method can determine a placement condition for the assist pattern based on the region where the effective evaluation point is placed and place the assist pattern around the design pattern based on the placement condition to create the pattern layout.

According to another embodiment, a photomask designing program causing a computer to execute a computation for creating a pattern layout having an assist pattern placed around a design pattern is disclosed. The computation includes placing a plurality of evaluation points around the design pattern and setting an evaluation index for imaging properties of the design pattern on an imaging surface. The computation includes combining a light intensity distribution of the design pattern with light intensity distributions of the evaluation points to obtain a light intensity distribution of the design pattern on the imaging surface and evaluating the light intensity distribution of the design pattern on the imaging surface using the evaluation index to determine a region where an effective evaluation point is placed. In addition, the computation includes determining an placement condition for the assist pattern based on the region where the effective evaluation point is placed and placing an assist pattern around the design pattern based on the placement condition to create a pattern layout.

Embodiments will be exemplified below with reference to the drawings.

Since an optical system in an exposure apparatus is a partially-coherent imaging optical system, a light intensity distribution (optical image) formed on an imaging surface results from the nonlinear superposition with respect to the intensity and amplitude of light of each position. This makes it difficult to evaluate the imaging properties at positions on the imaging surface independently from the other positions thereon, these positions respectively corresponding to positions on a photomask.

For this reason, in this embodiment, a partially-coherent imaging optical system is decomposed into a sum of coherent systems (eigenvalue expansion), and then approximated by an approximation method to obtain an approximately-coherent imaging optical system. Moreover, an evaluation index for the imaging properties of a design pattern on an imaging surface is obtained by forming the approximately-coherent imaging optical system.

In this case, in each obtained coherent imaging optical system, a light intensity distribution (optical image) is formed on the imaging surface by linear combination of the amplitudes of light emitted from positions on the photomask. Specifically, the approximately-coherent imaging optical system allows evaluation on the imaging properties of light emitted from positions on the photomask independently from those of the other positions on the photomask. Note that this evaluation is made using an evaluation index for the imaging properties of the design pattern on the imaging surface. The evaluation index will be described in detail later.

By making such an evaluation, it is possible to specify a region in which the lithographic latitude can be enhanced. Accordingly, in designing a photomask, an appropriate assist pattern can be placed easily by placing the assist pattern on the basis of the size, shape, and position of the specified region.

FIG. 1 is a flowchart for exemplifying a photomask designing method according to this embodiment.

Figure 2:
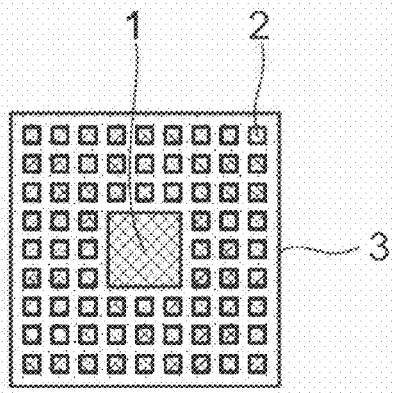
FIG. 2 is a schematic view for exemplifying a design pattern and evaluation points.

FIG. 2 is a schematic view for exemplifying a design pattern and evaluation points.

Figure 3:
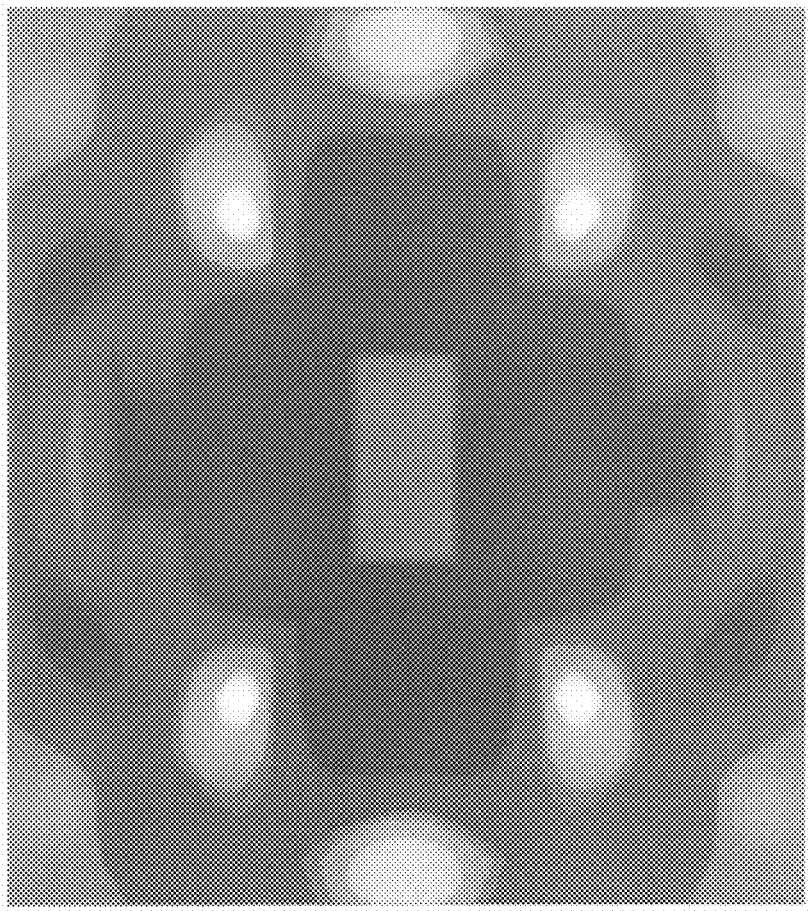
FIG. 3 is a schematic view for exemplifying an evaluation result.

FIG. 3 is a schematic view for exemplifying an evaluation result.

Figure 4:
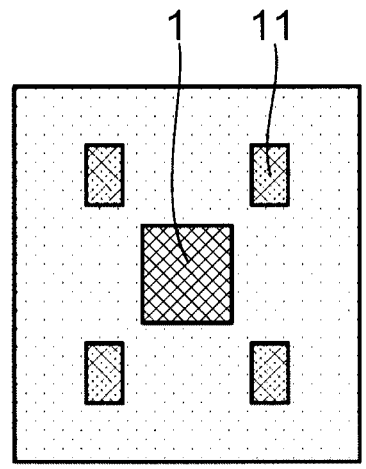
FIG. 4 is a schematic view for exemplifying assist patterns placed based on the evaluation result.

FIG. 4 is a schematic view for exemplifying assist patterns placed based on the evaluation result. First, multiple evaluation points are placed around a desired design pattern (Step S1). For example, as shown in FIG. 2, a design pattern 1 and multiple evaluation points 2 are placed in an evaluation region 3. Each of pitches of the evaluation points 2 is smaller than the design pattern 1 and placed around the design pattern 1. In this case, each of pitches of the evaluation points 2 is preferably smaller than an assist pattern 11 described later. Moreover, the points 2 are preferably placed to cover the region 3 in a matrix pattern, for example, as exemplified in FIG. 2. Furthermore, accuracy of a placed condition for an assist pattern described later can be improved if the pitches of the evaluation points 2 is made small. Incidentally, the shape, size, placement, number, and the like of the design pattern 1 and the evaluation points 2 are not limited to those exemplified, and can be modified as appropriate.

Next, optical proximity correction (OPC) is performed on the design pattern 1 (Step S2).

Optical proximity correction is a technique to perform correction regarding diffraction and interference of light on a design pattern so that an intended pattern may be transferred after exposure. Here, Step S2 is not absolutely necessary. However, a design pattern can be formed accurately when optical proximity correction is performed, whereby accuracy can be improved in evaluation, placement condition for an assist pattern, and the like, which are described later. Incidentally, a known technique may be adopted as optical proximity correction, and detailed description thereof is omitted.

Next, an evaluation index is set for the imaging properties of the design pattern 1 on an imaging surface (Step S3).

At this point, a position to evaluate using an evaluation index is set for each evaluation index.

Examples of the evaluation index for the imaging properties of the design pattern on the imaging surface include "light intensity for the design pattern," an "integrated value of the light intensity for the design pattern," and a "gradient of the light intensity distribution (optical image) of the design pattern." When the evaluation index is the "light intensity for the design pattern," a region of the design pattern can be evaluated. When the evaluation index is the "integrated value of the light intensity for the design pattern," the region of the design pattern can be evaluated. When the evaluation index is the "gradient of the light intensity distribution of the design pattern," a position of a pattern edge of the design pattern can be evaluated.

Thus, the evaluation index and the position to evaluate are selected in accordance with the shape and dimension of the design pattern 1, the exposure conditions, and the like. The evaluation index and the position to evaluate are set as selected. At this time, either a single evaluation index can be selected, or multiple evaluation indexes can be selected for complex evaluation. Detailed description of the evaluation index will be given later.

Next, a light intensity distribution (optical image) is obtained for each of cases where an evaluation point is placed (Step S4).

Specifically, a light intensity distribution of the design pattern 1 is combined with light intensity distributions of the evaluation points 2 to thereby obtain a light intensity distribution of the design pattern 1 on the imaging surface.

Since an approximately-coherent imaging optical system is obtained in this embodiment as described above, a light intensity distribution (optical image) is formed on the imaging surface by the linear combination of the amplitudes of light emitted from each position on a photomask. Thus, a light intensity distribution of the design pattern 1 on the imaging surface can be obtained through simulation by combining the light intensity distribution of the design pattern 1 with the light intensity distribution of the evaluation point 2 (the light intensity distribution of any evaluation point or the light intensity distributions of multiple evaluation points).

Next, the light intensity distribution of the design pattern 1 on the imaging surface is evaluated using the evaluation index to thereby determine a region where an effective evaluation point 2 is placed (Step S5).

In other words, an evaluation is made on the impact each evaluation point has when placed.

The evaluation result can be represented as shown in FIG. 3, for example. The evaluation conditions in this case are as follows. The design pattern 1 is a contact hole having a diameter of approximately 100 nm. The evaluation index is the "gradient of the light intensity distribution (optical image) of the design pattern." The position to evaluate is a position of a pattern edge of the design pattern (contact hole). The numerical aperture (NA) of an immersion exposure apparatus is set to 1.3, and dipole illumination is adopted as a way of illumination.

In this case, a region where a favorable evaluation result is obtained when providing the evaluation point 2 (i.e., a region where an effective evaluation point 2 is placed) has a brighter tone in a monochrome color. Accordingly, a portion with a brighter tone in the monochrome color is a region suitable for placing an assist pattern.

Next, an placement condition for an assist pattern 11 is determined based on the region where the effective evaluation point 2 is placed (Step S6).

Examples of the placement condition for the assist pattern 11 include the size, shape, placement, and the like of the assist pattern 11.

The placement condition for the assist pattern 11 is set so as to include at least a portion of the region where the effective evaluation point 2 is placed. In other words, the region where the assist pattern 11 is to be placed is set to include as many evaluation points 2 having favorable evaluation results as possible. When evaluation points 2 are placed closely to each other, the sizes, shapes, and placements of the assist patterns 11 to be placed are set to include as many evaluation points 2 closely placed as possible.

For example, when the evaluation result as shown in FIG. 3 is obtained, the assist patterns 11 are placed as shown in FIG. 4 in accordance with the size, shape, and placement of portions having a brighter tone in the monochrome color. In this manner, it is possible to obtain a pattern layout in which the assist patterns 11 having appropriate sizes and shapes are placed at appropriate positions around the design pattern 1.

Next, assist patterns 11 are placed around the design pattern 1 based on the placement condition for the assist pattern 11 to create a pattern layout (Step S7).

Furthermore, optical proximity correction is performed on the design pattern 1 (Step S8).

Here, no optical proximity correction is performed on the placed assist patterns 11.

Next, evaluation is made on the lithographic latitude of the design pattern 1 subjected to the optical proximity correction (Step S9).

When it is evaluated that the design pattern 1 has the lithographic latitude, the pattern layout subjected to the optical proximity correction at Step S8 is adopted, and the creation of the pattern layout is completed.

(eigenvalue expansion), and then approximated by an approximation method to obtain an approximately-coherent imaging optical system.

Here, the eigenvalue expansion performed on the partially-coherent imaging optical system can be represented by the following formula (1).

[Mathematical formula 1]

$$I = \sum_m \sigma_m I_m = \sum_m \sigma_m |E_m|^2 = \sum_m \sigma_m \left| \sum_{i,j} E_{ij}^{(m)} \right|^2 \quad (1)$$

Here, "I" is the sum of light intensity distributions (optical images), "$\sigma_m$" is an m-order eigenvalue, "$I_m$" is an m-order light intensity distribution (optical image), "$E_m$" is an amplitude distribution in an electric field of m-order light, and "$E_{ij}^{(m)}$" is an amplitude distribution in an electric field of m-order light emitted from any position (i, j) on the photomask.

Moreover, the formula (1) can be represented by a formula (2).

[Mathematical formula 2]

$$I = \sum_m \sigma_m |E_{main}^{(m)} + E_1^{(m)} + E_2^{(m)} + E_3^{(m)} + \ldots|^2 \quad (2)$$

$$= \sum_m \sigma_m [E_{main}^{(m)} \cdot E_{main}^{*(m)} + (E_1^{(m)} + E_2^{(m)} + E_3^{(m)} + \ldots) \cdot E_{main}^{*(m)} + E_{main}^{(m)} \cdot (E_1^{(m)} + E_2^{(m)} + E_3^{(m)} + \ldots)^* +$$

$$(E_1^{(m)} + E_2^{(m)} + E_3^{(m)} + \ldots) \cdot (E_1^{(m)} + E_2^{(m)} + E_3^{(m)} + \ldots)^*]$$

Meanwhile, when it is evaluated that the design pattern 1 has no lithographic latitude, the processing returns to Step S6, and the placement condition for the assist pattern 11 is modified. For example, when the assist pattern 11 is too large, the assist pattern 11 may be transferred at the time of exposure. In such a case, the assist pattern 11 having a smaller size is prepared at Step S6 and placed at Step S7, followed by Steps S8 and S9 again.

At this time, the lithographic latitude can be evaluated through simulation. Incidentally, a known technique may be adopted to evaluate the lithographic latitude, and description thereof is omitted.

Here, "$E_{main}^{(m)}$" is an amplitude distribution in an electric field of m-order light emitted from an evaluation point on the photomask. Moreover, "*" in the formula represents complex conjugate.

In this case, the value of a product of the respective terms "$E_{ij}^{(m)}$" in the formula (2) is extremely small, and thus can be omitted.

Accordingly, the formula (2) can be substantially represented by the following formula (3). In other words, by performing linear approximation on the formula (1), which represents the partially-coherent imaging optical system, the formula (3) representing the coherent imaging optical system can be led therefrom.

[Mathematical formula 3]

$$I \approx \sum_m \sigma_m [E_{main}^{(m)} \cdot E_{main}^{*(m)} + (E_1^{(m)} + E_2^{(m)} + E_3^{(m)} + \ldots) \cdot E_{main}^{*(m)} + E_{main}^{(m)} \cdot (E_1^{(m)} + E_2^{(m)} + E_3^{(m)} + \ldots)^*] \quad (3)$$

$$= \sum_m \sigma_m E_{main}^{(m)} \cdot E_{main}^{*(m)} + \sum_m \sigma_m \sum_{i,j \neq main} (E_{ij}^{(m)} \cdot E_{main}^{*(m)} + E_{main}^{(m)} \cdot E_{ij}^{*(m)})$$

A photomask is designed based on the pattern layout created in this manner. A known technique may be adopted for processing other than the above-described creation of a pattern layout, and description thereof is omitted.

Next, the evaluation index is further exemplified.

The evaluation index can be obtained as follows.

First, as described above, the partially-coherent imaging optical system is decomposed into a sum of coherent systems Next, the evaluation index is obtained based on the formula (3).

As described above, examples of the evaluation indexes include the "light intensity for the design pattern," the "integrated value of the light intensity for the design pattern," and the "gradient of the light intensity distribution (optical image) of the design pattern."

Figure 5:
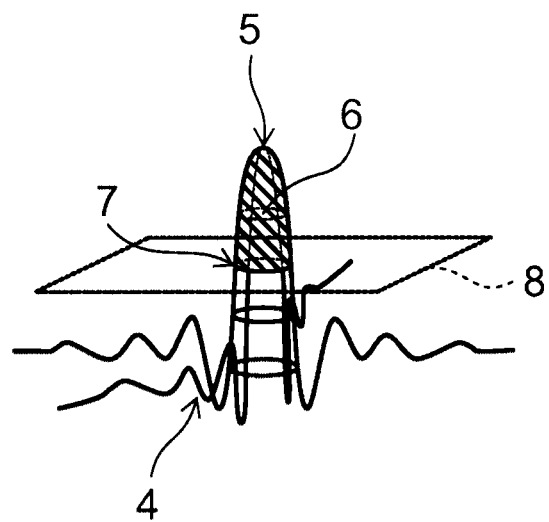
FIG. 5 is a schematic view for visually exemplifying the evaluation indexes.

FIG. 5 is a schematic view for visually exemplifying the evaluation indexes.

As shown in FIG. 5, "light intensity 5 for the design pattern" can be evaluated by the height of a light intensity distribution (optical image) 4 in a region corresponding to the design pattern 1. Specifically, the "light intensity 5 for the design pattern" can be evaluated by the height of the light intensity distribution (optical image) 4 of the design pattern 1 on an imaging surface 8. In this case, the "light intensity 5 for the design pattern" is preferably evaluated at a central position $(x_o, y_o)$ of the design pattern 1. For example, if the height of the light intensity distribution (optical image) 4 at the central position $(x_o, y_o)$ of the design pattern 1 is high (i.e., if the "light intensity 5 for the design pattern" is high), it can be evaluated that the imaging properties, the lithographic latitude, and the like can be improved.

An "integrated value 6 of the light intensity for the design pattern" can be evaluated by the volume of the light intensity distribution (optical image) 4 in the region corresponding to the design pattern. For example, if the volume of the light intensity distribution (optical image) 4 in the region corresponding to the design pattern is large (i.e., if the "integrated value 6 of the light intensity for the design pattern" is large), it can be evaluated that the imaging properties, the lithographic latitude, and the like can be improved.

A "gradient 7 of the light intensity distribution (optical image) of the design pattern" can be evaluated by the gradient of an outer line of the light intensity distribution (optical image) 4 at a pattern edge position $(x_1, y_1)$ of the design pattern. For example, if the gradient of an outer line of the light intensity distribution (optical image) 4 ("gradient 7 of the light intensity distribution (optical image) of the design pattern") is high (i.e., steep), it can be evaluated that the imaging properties (particularly, exposure margin), the lithographic latitude, and the like can be improved.

Here, the following formula (4) in the formula (3) can be used as the evaluation formula for the "light intensity for the design pattern."

[Mathematical formula 4]

$$\sum_m \sigma_m (E_{ij}^{(m)} \cdot E_{main}^{*(m)} + E_{main}^{(m)} \cdot E_{ij}^{*(m)}) \quad (4)$$

When evaluating a formed light intensity distribution (optical image) by "light intensity for the design pattern," the evaluation is preferably made by "light intensity for the design pattern" at the central position $(x_o, y_o)$ of the design pattern 1.

In this case, the following formula (5) can be used as the evaluation formula for the "light intensity for the design pattern" at the central position $(x_o, y_o)$ of the design pattern 1.

[Mathematical formula 5]

$$\sum_m \sigma_m [E_{ij}^{(m)}(x_0, y_0) \cdot E_{main}^{*(m)}(x_0, y_0) + E_{main}^{(m)}(x_0, y_0) \cdot E_{ij}^{*(m)}(x_0, y_0)] \quad (5)$$

Moreover, an "integrated value of the light intensity for the design pattern" used as the evaluation index can be obtained from the sum of values of "light intensity for the design pattern" in the region of the design pattern (i.e., the volume of the light intensity distribution (optical image) 4 in the region of the design pattern). For this purpose, as the evaluation formula for the "integrated value of the light intensity for the design pattern," the following formula (6) can be led from the formula (5).

[Mathematical formula 6]

$$\sum_m \sigma_m \left[ \int_{(x,y) \le S} \int E_{ij}^{(m)}(x,y) \cdot E_{main}^{*(m)}(x,y) + E_{main}^{(m)}(x,y) \cdot E_{ij}^{*(m)}(x,y) dx dy \right] \quad (6)$$

Moreover, a "gradient of the light intensity distribution (optical image) of the design pattern" used as the evaluation index can be led from the formula (3), and can be represented by the following formula (7).

[Mathematical formula 7]

$$\left(\frac{dI}{dx}\right)_{x=edge} \propto \sum_m \sigma_m E_{main}^{(m)} \cdot E_{main}^{*(m)'} + \sum_{i,j \ne main} \left[\sum_m \sigma_m (E_{main}^{(m)} \cdot E_{ij}^{*(m)'} + E_{ij}^{(m)} \cdot E_{main}^{*(m)'})\right] + c.c. \quad (7)$$

Here, "'" in the formula represents the derivative (d/dx), and "c.c." represents complex conjugate.

The following formula (8) included in the formula (7) can be used as the evaluation formula.

[Mathematical formula 8]

$$\sum_m \sigma_m (E_{main}^{(m)} \cdot E_{ij}^{*(m)'} + E_{ij}^{(m)} \cdot E_{main}^{*(m)'}) \quad (8)$$

In this case, the "gradient of the light intensity distribution (optical image) of the design pattern" is preferably evaluated at a position $(x_1, y_1)$ corresponding to a pattern edge of the design pattern 1. For this reason, the following formula (9) can be led from the formula (8).

[Mathematical formula 9]

$$\sum_m \sigma_m [E_{main}^{(m)}(x_1, y_1) \cdot E_{ij}^{*(m)'}(x_1, y_1) + E_{ij}^{(m)}(x_1, y_1) \cdot E_{main}^{*(m)'}(x_1, y_1)] \quad (9)$$

Any one of the evaluation indexes may be used, or multiple evaluation indexes may be used in combination. The evaluation indexes can be selected in accordance with the shape and dimension of the design pattern, exposure conditions, and the like.

Figure 6A:
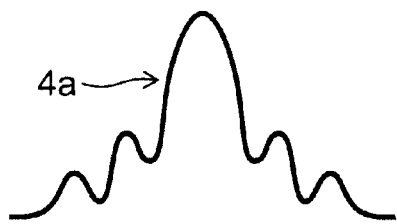
FIGS. 6A and 6B are schematic views each for exemplifying the cross section of a light intensity distribution (optical image)
Figure 6B:
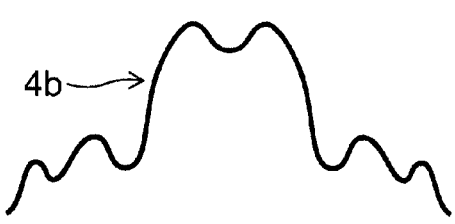

FIGS. 6A and 6B are schematic views each for exemplifying the cross section of a light intensity distribution (optical image). Incidentally, FIG. 6A is of a design pattern having a small dimension, and FIG. 6B is of a design pattern having a large dimension.

As shown in FIG. 6A, when a design pattern has a small dimension, an optical image 4a has a convex vertex. In such a case, the imaging properties, the lithographic latitude, and the like are preferably evaluated by the height of the optical image 4a. Accordingly, in such a case, the "light intensity for the design pattern" can be selected as the evaluation index.

Meanwhile, as shown in FIG. 6B, when a design pattern has a larger dimension, an optical image 4b may have a concave portion formed on a vertex thereof. In such a case, the imaging properties, the lithographic latitude, and the like are preferably evaluated by the volume of the optical image 4b, rather than the height of the optical image 4b. Accordingly, in such a case, the "integrated value of the light intensity for the design pattern" can be selected as the evaluation index.

When the exposure margin is of importance, a more columnar optical image, namely, an optical image having an outer line with a higher gradient (steeper gradient), is preferable. Accordingly, in such a case, the "gradient of the light intensity distribution (optical image) of the design pattern" can be selected as the evaluation index.

According to this embodiment, an evaluation index for the imaging properties of a design pattern on an imaging surface is obtained by forming the approximately-coherent imaging optical system. Additionally, by using the evaluation indexes thus obtained, it is possible to evaluate the imaging properties of light emitted from positions around the design pattern, independently from each other. Thus, an appropriate assist pattern is easily placed by utilizing these characteristics.

Next, a photomask designing program according to this embodiment will be exemplified.

Note that detailed description of the same content as that exemplified for the photomask designing method will be omitted as appropriate.

In order to execute the photomask designing program, the photomask designing program according to this embodiment is stored in an unillustrated storage unit provided in a computer. Here, while stored in an unillustrated recording medium, for example, the photomask designing program can be supplied to the computer, read out from the recording medium, and then stored in the unillustrated storage unit provided in the computer. Alternatively, the program can be stored in the unillustrated storage unit provided in the computer through a communications line or the like connected to the computer.

The photomask designing program stored in the unillustrated storage unit provided in the computer is capable of executing, for example, the following procedures (1) to (9).

(1) A procedure of placing multiple evaluation points around a desired design pattern based on an input from an unillustrated database or an input by an operator.

(2) A procedure of performing optical proximity correction (OPC) on a pattern layout in which the multiple evaluation points are placed around the design pattern.

Note that the procedure (2) is not absolutely necessary. However, the design pattern can be formed accurately when optical proximity correction is performed, whereby accuracy can be improved in subsequent procedures.

(3) A procedure of setting an evaluation index for the imaging properties of the design pattern on an imaging surface on the basis of the input from the unillustrated database or the input by the operator.

At this point, for each evaluation index, a position to evaluate is set where evaluation is made using the evaluation index.

The evaluation index can be at least one selected from the group consisting of "light intensity for the design pattern," an "integrated value of the light intensity for the design pattern," and a "gradient of the light intensity distribution of the design pattern."

(4) A procedure of combining a light intensity distribution of the design pattern with light intensity distributions of the evaluation points to obtain a light intensity distribution of the design pattern on the imaging surface.

(5) A procedure of evaluating the light intensity distribution of the design pattern on the imaging surface using the evaluation index to determine a region where an effective evaluation point is placed.

(6) A procedure of determining a placement condition for an assist pattern on the basis of the region where the effective evaluation point is placed.

Examples of the placement condition for the assist pattern include the size, shape, placement, and the like of the assist pattern.

(7) A procedure of placing an assist pattern around the design pattern on the basis of the placement condition for the assist pattern to create a pattern layout.

(8) A procedure of performing optical proximity correction on the design pattern 1.

(9) A procedure of evaluating the lithographic latitude of the design pattern 1 subjected to the optical proximity correction.

In this case, when it is evaluated that the design pattern 1 has the lithographic latitude, the pattern layout subjected to the optical proximity correction in the procedure (8) is adopted, and the creation of the pattern layout is completed.

Meanwhile, when it is evaluated that the design pattern 1 has no lithographic latitude, the placement condition for the assist pattern in the procedure (6) is modified. Then, the procedures (7), (8), and (9) can be performed again. Alternatively, when it is evaluated that the design pattern 1 has no lithographic latitude, the operator may be informed of the evaluation result.

Note that, the photomask designing program according to this embodiment may be executed by a single computation unit, or executed by multiple computation units part by part.

The photomask designing program according to this embodiment uses the evaluation index for the imaging properties of the design pattern on the imaging surface. Accordingly, the imaging properties of light emitted from positions around the design pattern are evaluated independently from each other. Thus, an appropriate assist pattern is easily placed.

Next, a photomask designing apparatus according to this embodiment will be exemplified.

Note that detailed description of the same content as that exemplified for the photomask designing method will be omitted as appropriate.

Figure 7:
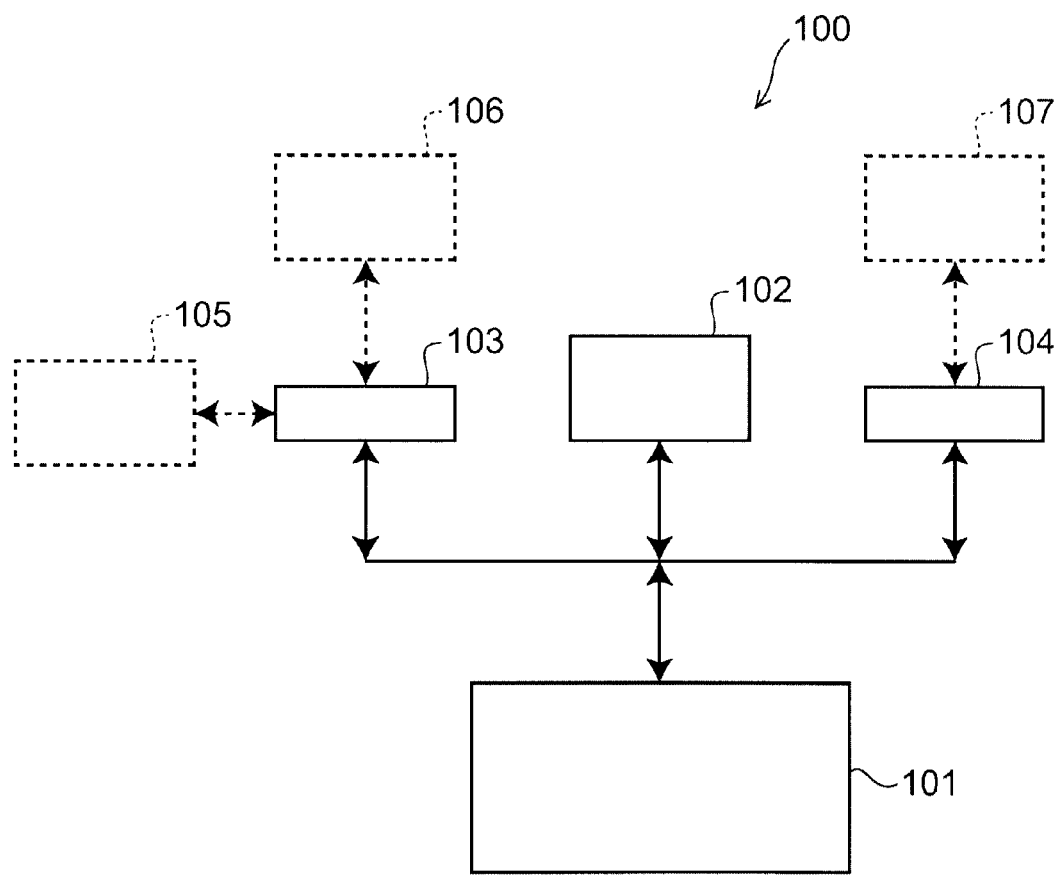
FIG. 7 is a block diagram for exemplifying the photomask designing apparatus according to this embodiment.

FIG. 7 is a block diagram for exemplifying the photomask designing apparatus according to this embodiment.

As shown in FIG. 7, a photomask designing apparatus 100 includes a pattern design unit 101, an evaluation-information storage unit 102, an input unit 103, and an output unit 104.

An input member 105 may be connected to the input unit 103 provided to electrically connect an external device to the photomask designing apparatus 100. Examples of the input member 105 include a keyboard, a mouse, and the like. A storage unit 106 for storing information necessary for designing a photomask is also connected to the input unit 103. Examples of the information stored in the storage unit 106 include information on a design pattern and on optical proximity correction.

An output member 107 may be connected to the output unit 104 provided to electrically connect an external device to the photomask designing apparatus 100. For example, a member for visualizing information forwarded from the pattern design unit 101 may be connected to the apparatus 100. Examples of the output member 107 include a display such as a flat panel display, and an image forming apparatus such as a printer. Examples of the output member 107 are not limited to these, and a member for visualizing information forwarded from the pattern design unit 101 can be selected as appropriate. Additionally, an unillustrated storage unit for storing the information forwarded from the pattern design unit 101, and the like can also be connected to the output unit 104.

The evaluation-information storage unit 102 stores information on evaluation indexes for the imaging properties of the design pattern on the imaging surface, information on evaluation positions to evaluate using the evaluation indexes, and information on evaluation points, and the like. Examples of the information on the stored evaluation indexes include information on "light intensity for the design pattern," information on an "integrated value of the light intensity for the design pattern," and information on a "gradient of the light intensity distribution (optical image) of the design pattern."

Examples of the information on the positions to evaluate using the evaluation indexes include information on predetermined positions corresponding to the evaluation indexes. For example, the "light intensity for the design pattern" may be used for a region of the design pattern (for example, a central position,) the "integrated value of the light intensity for the design pattern" may be used for a region of the design pattern, and the "gradient of the light intensity distribution (optical image) of the design pattern" may be used for a region of a pattern edge of the design pattern.

Examples of the information on the evaluation points include information on the shape, size, placement, number, and the like of the evaluation points.

The pattern design unit 101 extracts necessary information from the storage unit 106 and evaluation-information storage unit 102. Then, the pattern design unit 101 creates a pattern layout after performing setting, evaluation, and the like, which are described later. Then, the pattern design unit 101 forwards information on the created pattern layout to the output member 107 or the like via the output unit 104, so that the information can be displayed. Meanwhile, the information on the created pattern layout can be forwarded, through a communications line or the like connected to the output unit 104, to an unillustrated external device (for example, a photomask manufacturing apparatus or the like) or storing member.

Next, operations of the photomask designing apparatus 100 according to this embodiment will be exemplified. According to an input from an operator or the like, the pattern design unit 101 extracts necessary information from the storage unit 106 and evaluation-information storage unit 102. Then, on the basis of the inputted and extracted information, a design pattern and multiple evaluation points are placed. Optical proximity correction is performed on the design pattern thus placed. Note that it is not absolutely necessary to perform optical proximity correction on the placed design pattern. However, a design pattern can be formed accurately when optical proximity correction is performed, whereby accuracy can be improved in evaluation, a placement condition for an assist pattern, and the like, which are described later. An evaluation index is then set for the imaging properties of the design pattern on an imaging surface. At this point, a position to evaluate using the evaluation index is set for each evaluation index. Additionally, a light intensity distribution of the design pattern is combined with light intensity distributions of the evaluation points to obtain a light intensity distribution (optical image) of the design pattern on the imaging surface. Further, the light intensity distribution of the design pattern on the imaging surface is evaluated using the evaluation index to determine a region where an effective evaluation point is placed. Hence, a placement condition for an assist pattern is determined based on the region where the effective evaluation point is placed. A pattern layout is thus created by placing an assist pattern around the design pattern on the basis of the placement condition.

Furthermore, optical proximity correction is performed on the created pattern layout. Still furthermore, evaluation is made on the acceptability of lithography of the pattern layout subjected to the optical proximity correction. At this time, when it is evaluated that the design pattern has lithographic latitude, information on the pattern layout is forwarded, via the output unit 104, to the output member 107, the unillustrated external device (for example, a photomask manufacturing apparatus or the like), storing member, or the like. Meanwhile, when it is evaluated that the design pattern has no lithographic latitude, the placement condition for the assist pattern is modified. Then, the modified pattern layout is again subjected to the optical proximity correction and the evaluation on the lithographic latitude. Alternatively, when it is evaluated that the design pattern has no lithographic latitude, the operator may be informed of the evaluation result.

The photomask designing apparatus 100 according to this embodiment uses the evaluation index for the imaging properties of the design pattern on the imaging surface. Accordingly, the imaging properties of light emitted from positions around the design pattern are evaluated independently from each other. Thus, an appropriate assist pattern is easily placed.

Next, a photomask manufacturing method according to this embodiment will be exemplified.

In the photomask manufacturing method according to this embodiment, the photomask designing method and the photomask designing apparatus 100 described above are used to create a pattern layout (exposed pattern data). Thereafter, a photomask is manufactured based on the created pattern layout (exposed pattern data). In this case, the photomask can be manufactured by adopting an etching process.

By the photomask manufacturing method according to this embodiment, an appropriate assist pattern is placed in the photomask thus obtained. Additionally, since an appropriate assist pattern is easily placed, the productivity, quality, yield, and the like of the photomask can be improved.

Next, a method for fabricating an electronic device according to this embodiment will be exemplified.

Note that the description is given by taking a method for fabricating a semiconductor device as an example.

The method for fabricating a semiconductor device involves repetition of multiple processes such as: formation of a pattern on a wafer by film formation, resist application, exposure, development, etching, resist removal, and the like; inspection; cleaning; thermal treatment; doping; diffusion; and planarization. In such a method for fabricating a semiconductor device, a photomask is manufactured by the above-described photomask manufacturing method, and the exposure is performed using the photomask thus manufactured.

Incidentally, the processes other than the above-described photomask manufacturing method can be performed by adopting a known technique, and description thereof is omitted.

The method for fabricating an electronic device according to this embodiment has been described by taking the method for fabricating a semiconductor device as an example thereof. However, the method for fabricating an electronic device is not limited thereto. The method can be widely applied to fabrication of an electronic device adopting a photolithography process such as pattern formation in manufacturing a flat panel display (for example, pattern formation for a liquid crystal color filter, array substrate, and the like).

By the method for fabricating an electronic device according to this embodiment, a circuit pattern or the like can be formed using the photomask in which an appropriate assist pattern is placed. This suppresses deterioration of the electric properties due to deformation of the circuit pattern or the like, as well as avoids bridging, breakage and the like in the circuit pattern. Thus, the yield, quality, and the like of the product can be improved.

Hereinabove, the embodiments have been exemplified. However, the invention is not limited to these descriptions.

For example, the number, placement, and the like of each component of the photomask designing apparatus 100 are not limited to those exemplified, and can be modified as appropriate.

Moreover, each component in the above-described embodiments can be combined with the others in all the possible manners, and these possible combinations are within the scope of the invention, as long as the characteristics of the invention are included therein.

While certain embodiments have been described, these embodiments have been presented by way of example only, and are not intended to limit the scope of the inventions. Indeed, the novel methods and programs described herein may be embodied in a variety of other forms; furthermore, various omissions, substitutions and changes in the form of the methods and programs described herein may be made without departing from the spirit of the inventions. The accompanying claims and their equivalents are intended to cover such forms or modifications as would fall within the scope and spirit of the invention.

The invention claimed is:

1. A photomask designing method for creating a pattern layout having an assist pattern placed around a design pattern, the method, implemented by at least one processor, comprising:
   placing a plurality of evaluation points around the design pattern;
   setting an evaluation index for imaging properties of the design pattern on an imaging surface;
   combining a light intensity distribution of the design pattern with light intensity distributions of the evaluation points to obtain a light intensity distribution of the design pattern on the imaging surface;
   evaluating the light intensity distribution of the design pattern on the imaging surface using the evaluation index to determine a region having an effective evaluation point placed;
   determining a placement condition for the assist pattern based on the region where the effective evaluation point is placed; and
   placing the assist pattern around the design pattern based on the placement condition to create the pattern layout,
   wherein the evaluation index is at least one selected from the group consisting of light intensity for the design pattern, an integrated value of the light intensity for the design pattern, and a gradient of the light intensity distribution of the design pattern,
   the following formula is used as an evaluation formula for the light intensity for the design pattern, $$\sum_m \sigma_m (E_{ij}^{(m)} \cdot E_{main}^{*(m)} + E_{main}^{(m)} \cdot E_{ij}^{*(m)}),$$

the following formula is used as an evaluation formula for the integrated value of the light intensity for the design pattern, $$\sum_m \sigma_m \left[ \iint_{(x,y) \leq S} E_{ij}^{(m)}(x,y) \cdot E_{main}^{*(m)}(x,y) + E_{main}^{(m)}(x,y) \cdot E_{ij}^{*(m)}(x,y) dx dy \right],$$

and
the following formula is used as an evaluation formula for the gradient of the light intensity distribution of the design pattern, $$\left(\frac{dI}{dx}\right)_{x=edge} \propto \sum_m \sigma_m E_{main}^{(m)} \cdot E_{main}^{*(m)'} + \sum_{i,j \neq main} \left[ \sum_m \sigma_m \left( E_{main}^{(m)} \cdot E_{ij}^{*(m)'} + E_{ij}^{(m)} \cdot E_{main}^{*(m)'} \right) \right] + c.c.$$

2. The method according to claim 1, wherein
   when the evaluation index is the light intensity for the design pattern, the evaluation is made in a region of the design pattern,
   when the evaluation index is the integrated value of the light intensity for the design pattern, the evaluation is made in the region of the design pattern, and
   when the evaluation index is the gradient of the light intensity distribution of the design pattern, the evaluation is made in a position of a pattern edge of the design pattern.

3. The method according to claim 1, wherein
   the placement condition for the assist pattern is set in a manner that the assist pattern includes at least a portion of the region where the effective evaluation point placed.

4. The method according to claim 1, further comprising after the placing the plurality of evaluation points around the design pattern, performing a first optical proximity correction on the design pattern.

5. The method according to claim 1, further comprising after the creating the pattern layout, performing a second optical proximity correction on the design pattern.

6. The method according to claim 5, further comprising evaluating a lithographic latitude of the design pattern subjected to the second optical proximity correction.

7. The method according to claim 6, wherein
   when it is evaluated that the design pattern has no lithographic latitude in the evaluating the lithographic latitude, the placement condition for the assist pattern is corrected in the determining the placement condition for the assist pattern.

8. The method according to claim 1, wherein
   each of pitches of the evaluation points is smaller than the design pattern.

9. The method according to claim 1, wherein
   each of pitches of the evaluation points is smaller than the assist pattern.

10. A non-transitory computer readable medium including computer executable instructions to execute a photomask designing operation causing a computer to execute a computation for creating a pattern layout having an assist pattern placed around a design pattern, the computation comprising:
    placing a plurality of evaluation points around the design pattern;
    setting an evaluation index for imaging properties of the design pattern on an imaging surface;
    combining a light intensity distribution of the design pattern with light intensity distributions of the evaluation points to obtain a light intensity distribution of the design pattern on the imaging surface;

evaluating the light intensity distribution of the design pattern on the imaging surface using the evaluation index to determine a region where an effective evaluation point is placed;

determining a placement condition for the assist pattern based on the region where the effective evaluation point is placed; and placing an assist pattern around the design pattern based on the placement condition to create a pattern layout, wherein the evaluation index is at least one selected from the group consisting of light intensity for the design pattern, an integrated value of the light intensity for the design pattern, and a gradient of the light intensity distribution pattern, of the design attern the following formula is used as an evaluation formula for the light intensity for the design pattern, $$\sum_m \sigma_m (E_{ij}^{(m)} \cdot E_{main}^{*(m)} + E_{main}^{(m)} \cdot E_{ij}^{*(m)}),$$

the following formula is used as an evaluation formula for the integrated value of the light intensity for the design pattern, $$\sum_m \sigma_m \left[ \iint_{(x,y) \leq S} E_{ij}^{(m)}(x,y) \cdot E_{main}^{*(m)}(x,y) + E_{main}^{(m)}(x,y) \cdot E_{ij}^{*(m)}(x,y) dx dy \right],$$

and the following formula is used as an evaluation formula for the gradient of the light intensity distribution of the design pattern, $$\left( \frac{dI}{dx} \right)_{x=edge} \propto \sum_m \sigma_m E_{main}^{(m)} \cdot E_{main}^{*(m)'} + \sum_{i,j \neq main} \left[ \sum_m \sigma_m \left( E_{main}^{(m)} \cdot E_{ij}^{*(m)'} + E_{ij}^{(m)} \cdot E_{main}^{*(m)'} \right) \right] + c.c.$$

11. The non-transitory computer readable medium according to claim 10, wherein
when the evaluation index is the light intensity for the design pattern, the evaluation is made in a region of the design pattern,
when the evaluation index is the integrated value of the light intensity for the design pattern, the evaluation is made in the region of the design pattern, and
when the evaluation index is the gradient of the light intensity distribution of the design pattern, the evaluation is made in a position of a pattern edge of the design pattern.

12. The non-transitory computer readable medium according to claim 10, wherein
the placement condition for the assist pattern is set in a manner that the assist pattern includes at least a portion of the region where the effective evaluation point is placed.

13. The non-transitory computer readable medium according to claim 10, further comprising
after the placing the plurality of evaluation points around the design pattern, performing first optical proximity correction on the design pattern.

14. The non-transitory computer-readable medium according to claim 10, further comprising
after the creating the pattern layout, performing second optical proximity correction on the design pattern.

15. The non-transitory computer readable medium according to claim 14, further comprising
evaluating a lithographic latitude of the design pattern subjected to the second optical proximity correction.

16. The non-transitory computer readable medium according to claim 15, wherein
when it is evaluated that the design pattern has no lithographic latitude in the evaluating the lithographic latitude, the placement condition for the assist pattern is corrected in the determining the placement condition for the assist pattern.

17. The non-transitory computer readable medium according to claim 10, wherein
each of pitches of the evaluation points is smaller than the design pattern.

18. The non-transitory computer readable medium according to claim 13, wherein
each of pitches of the evaluation points is smaller than the assist pattern.

* * * * *